(12) United States Patent
Chen et al.

(10) Patent No.: US 7,525,779 B2
(45) Date of Patent: Apr. 28, 2009

(54) DIODE STRINGS AND ELECTROSTATIC DISCHARGE PROTECTION CIRCUITS

(76) Inventors: Zi-Ping Chen, No. 58, Guangming St., Shindian City, Taipei (TW) 231; Ming-Dou Ker, 4F-3, No. 3, Lane 200 Pao-Shan Rd., Lin 8, Kao-Feng Li, E. District, Hsinchu 300 (TW)

( * ) Notice: Subject to any disclaimer, the term of this patent is extended or adjusted under 35 U.S.C. 154(b) by 0 days.

(21) Appl. No.: 11/205,378

(22) Filed: Aug. 17, 2005

(65) Prior Publication Data
US 2006/0044719 A1  Mar. 2, 2006

Related U.S. Application Data

(63) Continuation-in-part of application No. 11/004,348, filed on Dec. 3, 2004, now Pat. No. 7,372,109.

(30) Foreign Application Priority Data

Aug. 30, 2004 (TW) .............................. 93126050 A
Jun. 24, 2005 (TW) .............................. 94121148 A

(51) Int. Cl.
*H02H 9/00* (2006.01)
(52) U.S. Cl. ........................................ 361/56
(58) Field of Classification Search .................... 361/56
See application file for complete search history.

(56) References Cited

U.S. PATENT DOCUMENTS 5,530,612 A * 6/1996 Maloney ....................... 361/56
5,892,264 A   4/1999 Davis et al.
6,060,752 A * 5/2000 Williams ..................... 257/355
6,154,082 A * 11/2000 Bernard et al. .............. 357/310
6,373,105 B1 * 4/2002 Lin ............................. 257/357
6,426,855 B2 * 7/2002 Lee et al. ..................... 361/56

(Continued)

FOREIGN PATENT DOCUMENTS

JP   01106605 A  * 4/1989

OTHER PUBLICATIONS

Chen et al., "Characteristics of Low-Leakage Deep-Trench Diode for ESD Protection Design in 0.18-um SiGe BiCMOS Process", IEEE Trans Elec Devices, vol. 60, No. 7, pp. 1683-1689, Jul. 2003.

(Continued)

*Primary Examiner*—Stephen W Jackson
*Assistant Examiner*—Ann T Hoang

(57) ABSTRACT

Diode strings and electrostatic discharge circuits characterized by low current leakage. Each diode region provides a diode and has first and second regions. The first region is of a first conductive type and formed on a substrate, acting as a first electrode of a diode. The second region is of a second conductive type opposite to the first conductive type, formed in the first region and acting as a second electrode of a corresponding diode. The diodes are forward connected in series to form major anode and cathode of the diode string. An isolation region is of the second conductive type to isolate those diode regions. A bias resistor is connected between the isolation region and a first power line. During normal operation, the voltage of the first power line is not within the range between the voltages of the major anode and cathode.

32 Claims, 8 Drawing Sheets

U.S. PATENT DOCUMENTS

| | | | |
|---|---|---|---|
| 6,537,868 B1 * | 3/2003 | Yu | 438/237 |
| 6,611,028 B2 * | 8/2003 | Cheng et al. | 257/361 |
| 6,617,650 B1 * | 9/2003 | Chen et al. | 257/355 |
| 6,878,605 B2 | 4/2005 | Kim et al. | |
| 6,972,476 B2 * | 12/2005 | Chen et al. | 257/547 |
| 7,071,514 B1 * | 7/2006 | Ozard | 257/355 |
| 7,095,092 B2 | 8/2006 | Zhu et al. | |
| 2002/0109190 A1 | 8/2002 | Ker et al. | |
| 2002/0153586 A1 | 10/2002 | Majumdar et al. | |
| 2002/0154463 A1 * | 10/2002 | Mergens et al. | 361/56 |
| 2003/0047750 A1 | 3/2003 | Russ et al. | |
| 2005/0045909 A1 * | 3/2005 | Zhang | 257/173 |

OTHER PUBLICATIONS

Chen et al., "Low-Leakage Diode String Designs Using Triple-Well Technologies for RF-ESD Applications", IEEE Electron Device Letters, vol. 24, No. 9, pp. 595-597, Sep. 2003.

Voldman, "ESD Protection in a Mixed Voltage Interface and Multi-Rail Disconnected Power Grid Environment in 0.5. and 0.25-um Channel Length CMOS Technologies", pp. 3.4.1-3.4.10, 1994.

Dabral et al., "Designing On-Chip Power Supply Coupling Diodes for ESD Protection and Noise Immunity", pp. 5B.6.1-5B.6.11, 1993.

Dabral et al., "Core Clamps for Low Voltage Technologies", pp. 3.6.1-3.6.9, 1994.

Office Action of May 15, 2007 in U.S. Appl. No. 11/004,348, 8 pages.

Response to Office Action of May 15, 2007 in U.S. Appl. No. 11/004,348, 12 pages, dated Aug. 8, 2007.

Office Action of Oct. 16, 2007 in U.S. Appl. No. 11/004,348, 9 pages.

Response to Office Action of Oct. 16, 2007 in U.S. Appl. No. 11/004,348, 12 pages, dated Nov. 29, 2007.

Notice of Allowance of Jan. 2, 2008 in U.S. Appl. No. 11/004,348, 6 pages.

* cited by examiner

DIODE STRINGS AND ELECTROSTATIC DISCHARGE PROTECTION CIRCUITS

CROSS REFERENCE TO RELATED APPLICATIONS

This application is a continuation in part of U.S. patent application Ser. No. 11/004,348 filed on Dec. 3, 2004 now U.S. Pat. No. 7,372,109.

BACKGROUND

The present invention relates in general to diode strings and relevant ESD protection circuits. More particularly, it relates to diode strings and ESD protection circuits characterized by low current leakage during normal operation.

Among ESD protection devices, proper forward biasing of a diode during an ESD event allows only a small silicon area to be required for effective ESD protection.

A conventional diode string consists of several diodes connected in series. When coupled between high-voltage and low-voltage power lines, the conventional diode string acts as an ESD protection circuit, clamping the voltage across the power lines and protecting devices from high voltage stress. Nevertheless, a parasitic Darlington amplifier may be formed in the diode string by series-connected parasitic bipolar junction transistors (BJTs), resulting in constant substrate current leakage forward to a substrate. This substrate current leakage becomes more severe as operating temperature or diode count in the diode string increases.

Conventional solutions to the leakage problem include adding extra circuitry to reduce the current gain of the Darlington amplifier, or physically elimination of the Darlington amplifier.

SUMMARY

An object of the present invention is to reduce current leakage of a diode string during normal operation.

Another object of the present invention is to provide a diode string and a relevant ESD protection circuit characterized by low current leakage during normal operation.

A diode string is provided, comprising diode regions, a separation region and a bias resistor. Each diode region provides at least one diode and has first and second polarity regions. The first polarity region is of a first conductivity type on a substrate, acting as a first electrode of a corresponding diode. The second polarity region is of a second conductivity type opposite to the first conductivity type, in the first polarity region, acting as a second electrode of the corresponding diode. The diodes are connected in series to provide a major anode and a major cathode of the diode string. The separation region is of the second conductivity type, separating the diode regions from each other. The bias resistor is connected between the separation region and a first power line. During normal operation the voltage of the first power line is not within the range between the voltages on the major anode and cathode.

Another diode string characterized by low current leakage is further provided, comprising bipolar junction transistors (BJTs) and a bias resistor. Each BJT has a collector, an emitter and a base. The emitter of a BJT is connected to the base of the following BJT, and the base of the first BJT and the emitter of the last BJT act as two major electrodes of the diode string. The collectors of all the BJTs are coupled to a first power line through the bias resistor. During normal operation the voltage of the first power line is not within the range between the voltages of the major electrodes.

The bias resistor decreases the collector current in a parasitic Darlington amplifier, thereby depressing the current leakage during normal operation.

DESCRIPTION OF THE DRAWINGS

For a better understanding of the present invention, reference is made to a detailed description to be read in conjunction with the accompanying drawings, in which.

DETAILED DESCRIPTION

Figure 1A:
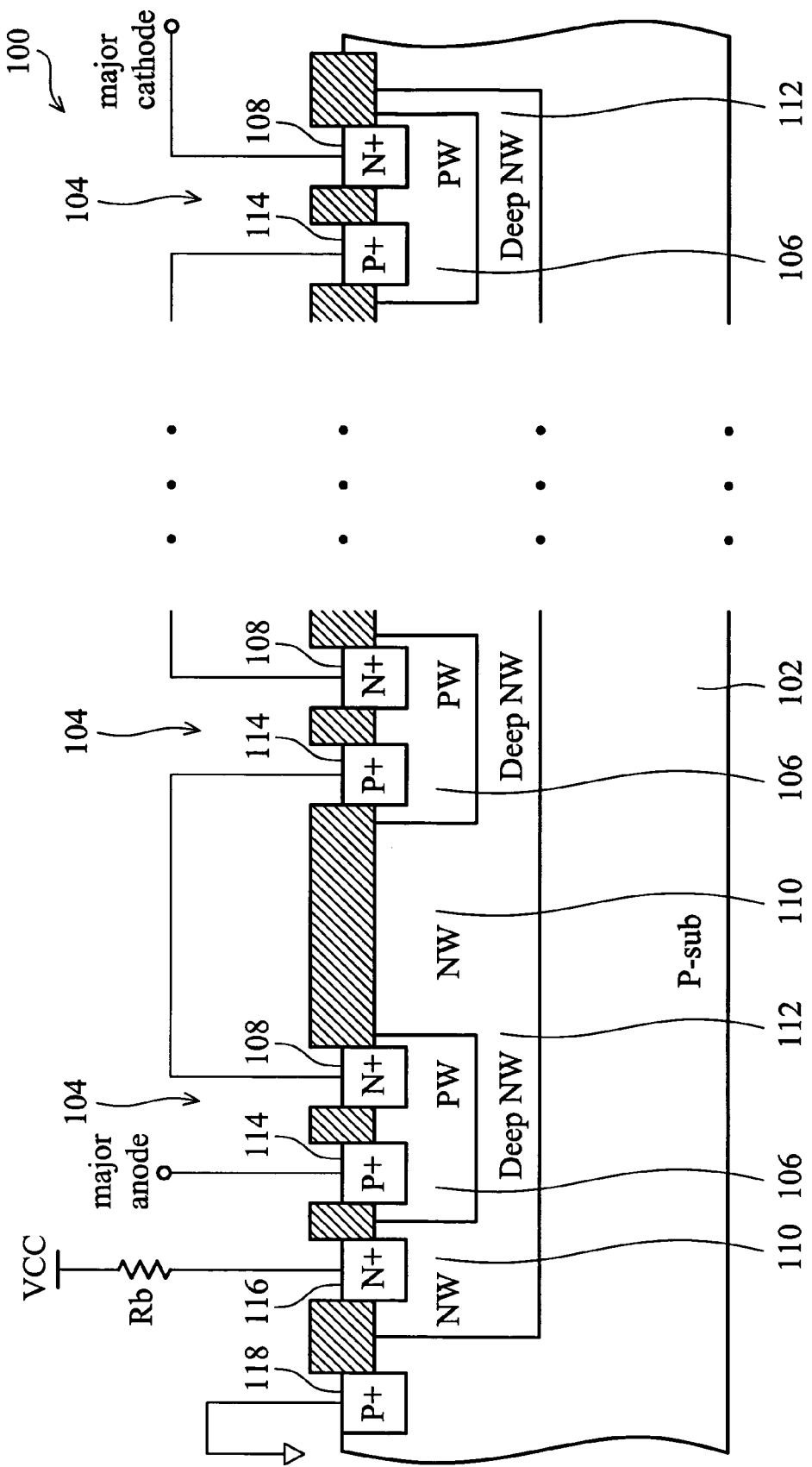
FIG. 1a is a cross section of a diode string according to an embodiment of the present invention.

FIG. 1a is a cross section of a diode string according to an embodiment of the present invention. In FIG. 1a, a diode string 100 is formed on a P-type substrate 102 of a chip, fabricated by, but not limited to, triple-well CMOS process.

Diode string 100 has diode regions 104, each providing at least one diode and having a P well 106 and a heavily-doped N region 108. P well 106 and heavily-doped N region 108 respectively act as an anode and a cathode of a diode. N well 110 surrounds diode regions 104. Deep N well 112 is deeper than N well 110 and contacts the bottoms of diode regions 104. N well 110 and deep N well 112 act as a separation region to electrically isolate P wells 106 not only from each other but also from P substrate 102.

Figure 1B:
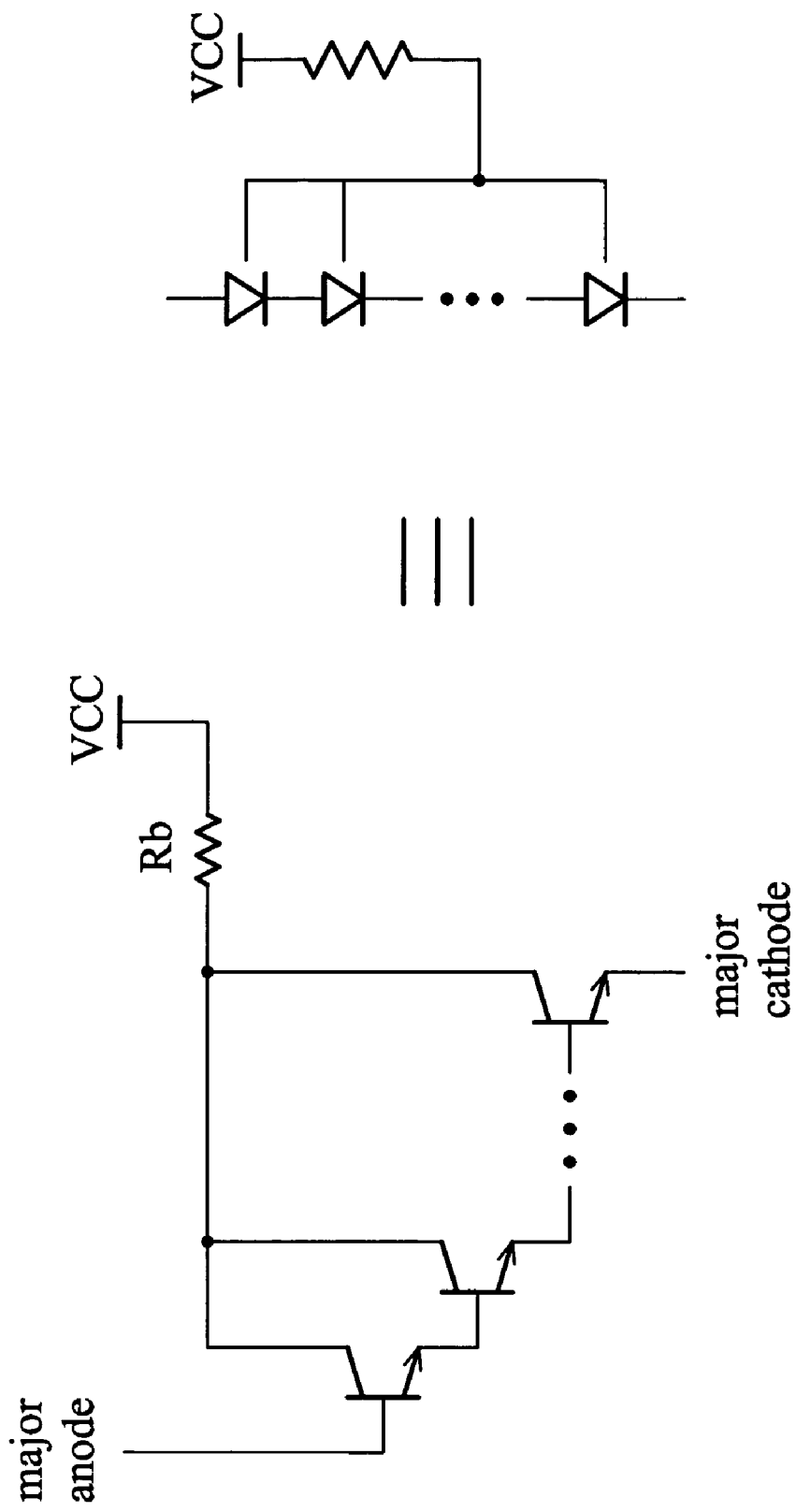
FIG. 1b shows an equivalent circuit for the diode string in FIG. 1a and a newly-defined symbol for a diode string embodying the present invention.

To form effective electrical contacts, P wells 106 have heavily-doped P regions 114, N well 110 a heavily-doped N region 116, and P substrate 102 a heavily-doped P region 118. The count of these heavily-doped regions is not fixed, depending on how little contact resistance is required by the circuit design. Depending upon the technology of the manufacturing process, heavily-doped regions can optionally be formed with silicide material on their surface to reduce sheet resistance. Isolation material can be formed on the surface of the chip to electrically isolate heavily-doped regions. In the embodiment of FIG. 1b, the isolation material is formed and positioned by, but not limited to, shallow trench isolation. Other processes, such as local oxidation, can also be applied to form and position isolation material.

Interconnection on a chip, generally comprising metal wires, contacts and vias, provides connections for devices. Through interconnection, the diodes are forward connected, whereby a cathode of a diode is connected to an anode of a following diode and the anode of the first diode and the cathode of the last diode respectively act as the major anode and cathode of the diode string 100. The count of the diodes connected in series depends upon the desired threshold voltage of the diode string. If the desired threshold voltage of the diode string is at least 4v and each diode can contribute 0.7v for the threshold voltage, the diode count in the diode string must not be less than 6, since 0.7×6=4.2>4.

Through interconnection, P substrate 102 is coupled to power line GND. Deep N well 112 and N well 110 are connected to a bias resistor Rb and then coupled to power line VCC. Bias resistor Rb can be, but is not limited to, a polysilicon resistor or a well resistor.

During normal operation, when no ESD occurs and the chip is properly powered, the voltage of power line VCC cannot be less than that on the major anode, to maintain junction reverse biasing of a PN between deep N well 112 and P well 106. In the embodiment of FIG. 1a, the voltages of power lines VCC and GND can be the highest and lowest voltage on the chip, respectively.

The left portion of FIG. 1b shows an equivalent circuit for the diode string in FIG. 1a and the right portion a newly-defined symbol for a diode string embodying the present invention.

Comparing the equivalent circuit of FIG. 1b with the device structure in FIG. 1a, the collector of each NPN BJT is deep N well 112 or N well 110, the base a P well 106, and the emitter a heavily-doped N region 108. Due to the forward connection, the emitter of a BJT is connected to the base of the next BJT. The base of the first BJT acts as the major anode of the diode string 100, and the emitter of the last BJT as the major cathode of the diode string 100. All collectors are connected and then coupled to power line VCC through bias resistor Rb.

The connection of the BJTs in FIG. 1b shows a Darlington amplifier with bias resistor Rb suppressing the collector current through the Darlington amplifier, thereby decreasing current leakage during normal operation. In another aspect, there is no resistor loaded on the current path from the major anode and the major cathode. Therefore, when the voltage difference between the major anode and the major cathode exceeds the threshold voltage of the diode string, the diode string is turned on and effectively conducts current to quickly release voltage stress or trigger another circuit.

The newly-defined symbol in the right portion of FIG. 1b will be used later to show in circuits possible locations for the diode string according to the invention.

Figure 2:
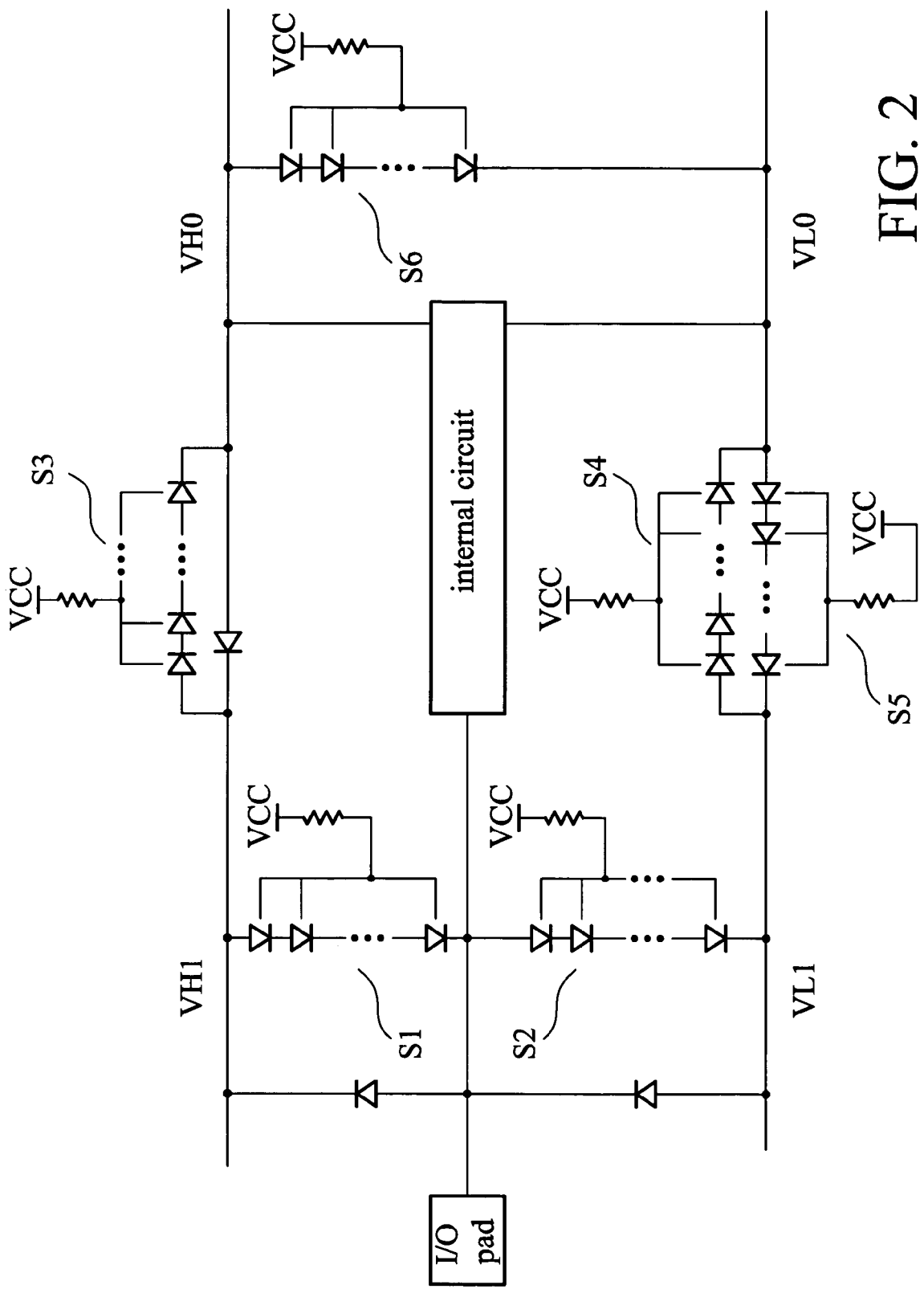
FIG. 2 shows a circuit with electrostatic discharge (ESD) protection circuits according to the present invention.

FIG. 2 shows a circuit with electrostatic discharge (ESD) protection circuits according to the present invention. Diode strings can function alone or cooperate with other ESD protection devices to provide further protection. FIG. 2 exemplifies, but does not limit, the locations where diode strings are positioned. Diode string S1 is between a power line VH1 and an input/output (I/O) pad and diode string S2 is between a power line VL1 and the input/output (I/O) pad, both protecting circuitry connected to the I/O pad from ESD damage. Each of the diode strings S3-S6 is connected between two power lines to clamp the voltage difference therebetween, thereby protecting circuitry coupled across two power lines from ESD damage.

During normal operation, if the voltage supplied to the power line VH1 exceeds that supplied to the power line VH0, and the voltage supplied to the power line VL1 is lower than that supplied to the power line VL0, diode strings S1-S6 are closed. As a result, diode string S4 is reverse biased while diode strings S1-S3 and S5-S6 are forward biased during normal operation. Based upon the supply voltage arrangement, power line VH1 can be the same as power line VCC.

Figure 3A:
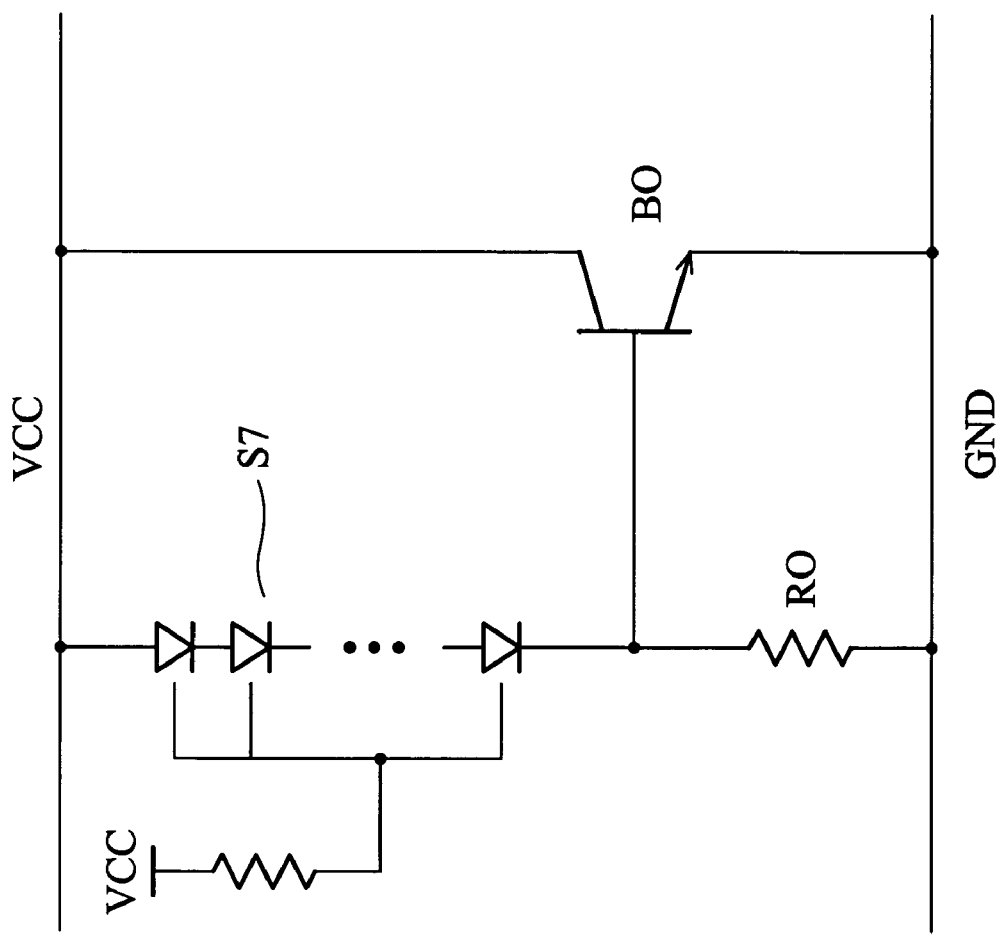
FIGS. 3a and 3b show two ESD protection circuits, each having an ESD protection trigger circuit according to the invention and connected between power lines VCC and GND.
Figure 3B:
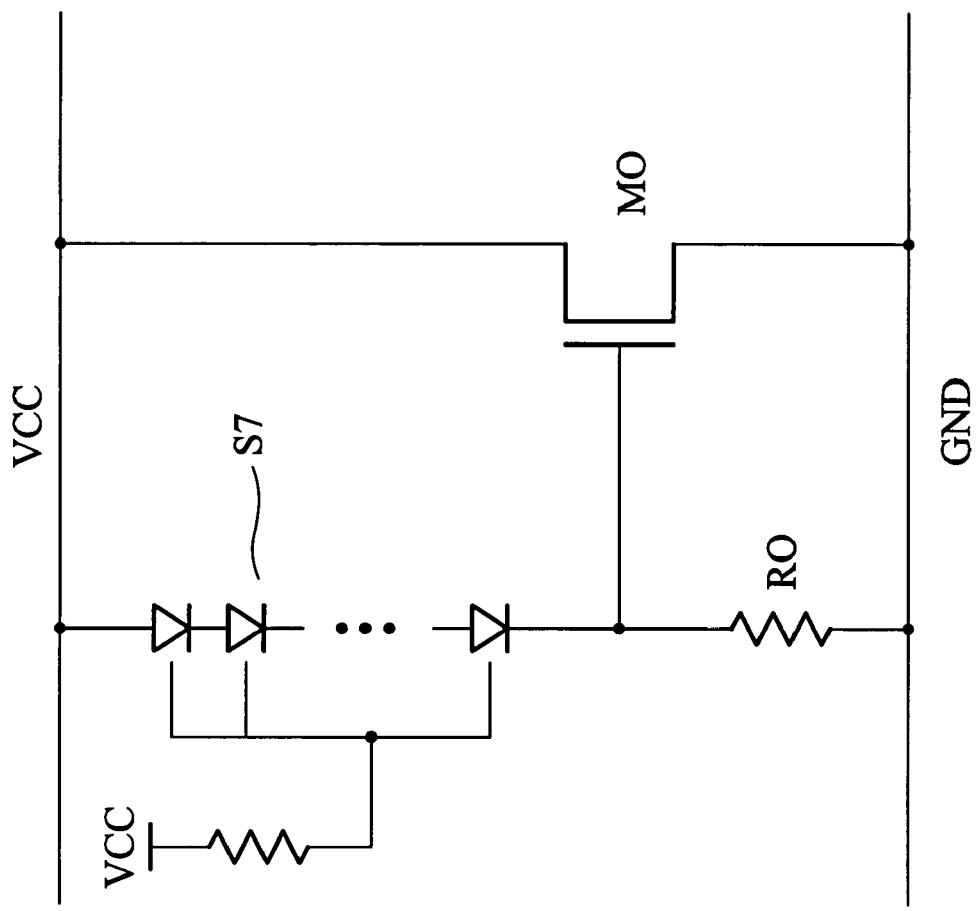

A diode string can function with an ESD protection trigger circuit in an ESD protection circuit. FIGS. 3a and 3b show two ESD protection circuits, each having an ESD protection trigger circuit according to the invention and connected between power lines VCC and GND. As shown in FIGS. 3a and 3b, diode string S7 connects with resistor R0 to form an ESD protection trigger circuit connected between power lines VCC and GND. The connection node between diode string S7 and resistor R0 can be connected to a trigger node of a primary ESD protection device. The primary ESD protection device is not limited to the bipolar junction transistor (BJT) B0 shown in FIG. 3a, or a field effect transistor such as the metal-oxide-semiconductor transistor (MOS) M0 shown in FIG. 3b. In FIG. 3a, the trigger node is the base of BJT B0, and, in FIG. 3b, the trigger node is the gate of MOS M0. When a pulse relatively positive to power line GND occurs on power line VCC, the voltage at the trigger node temporarily rises to trigger the primary ESD protection device and release ESD stress.

Figure 4:
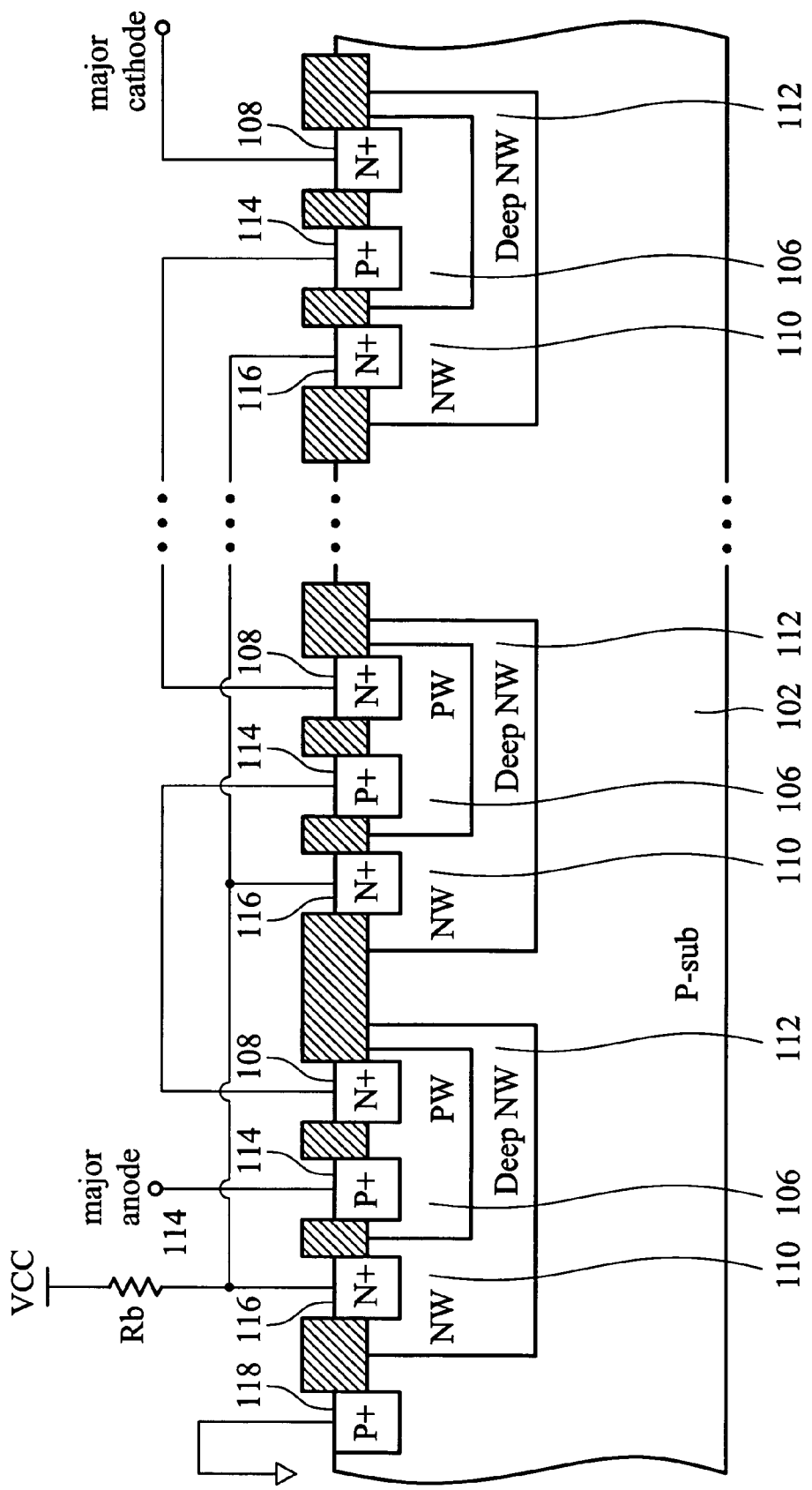
FIGS. 4 to 6 show cross sections of three diode strings embodying the present invention.
Figure 5:
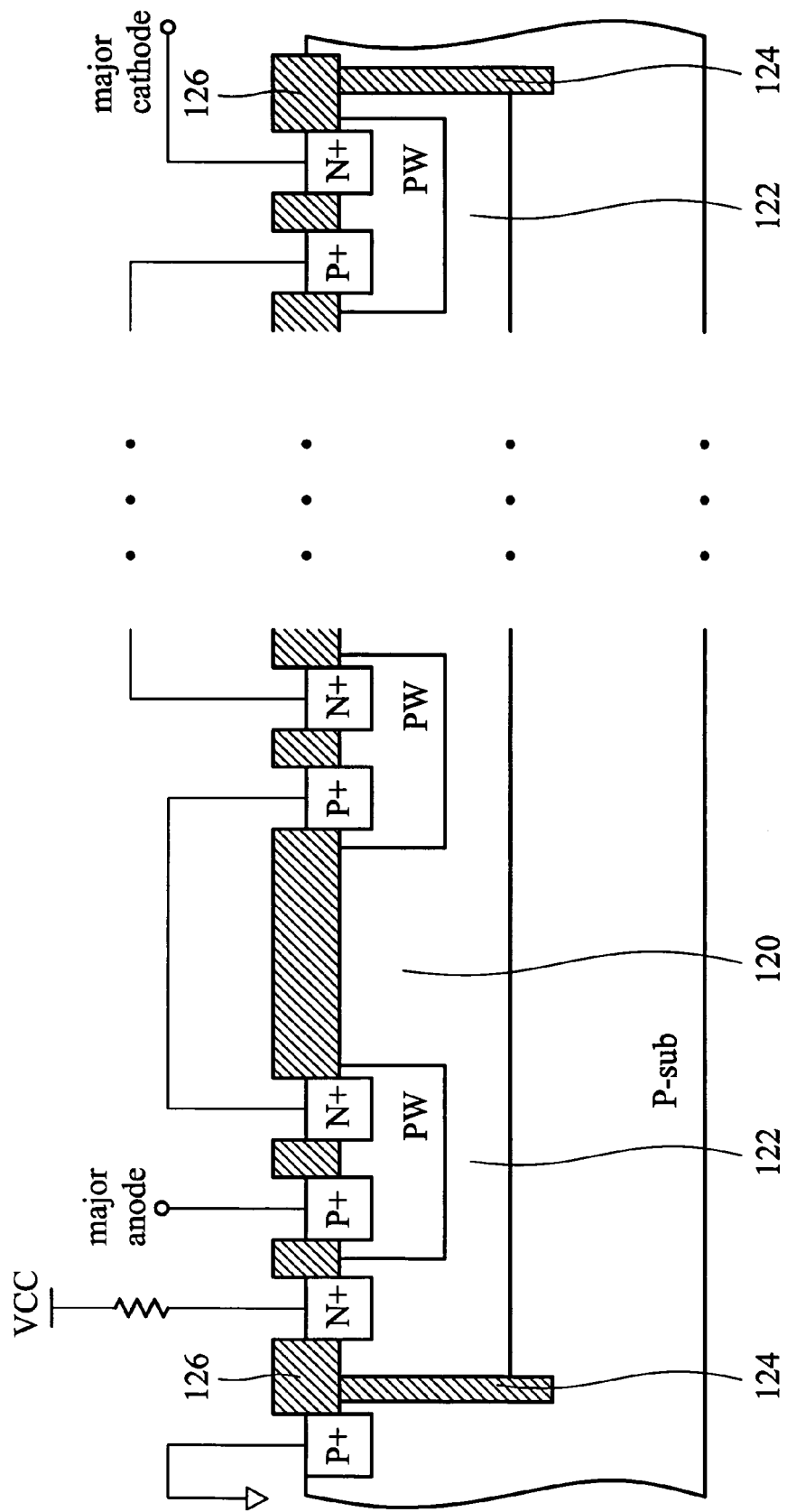
Figure 6:
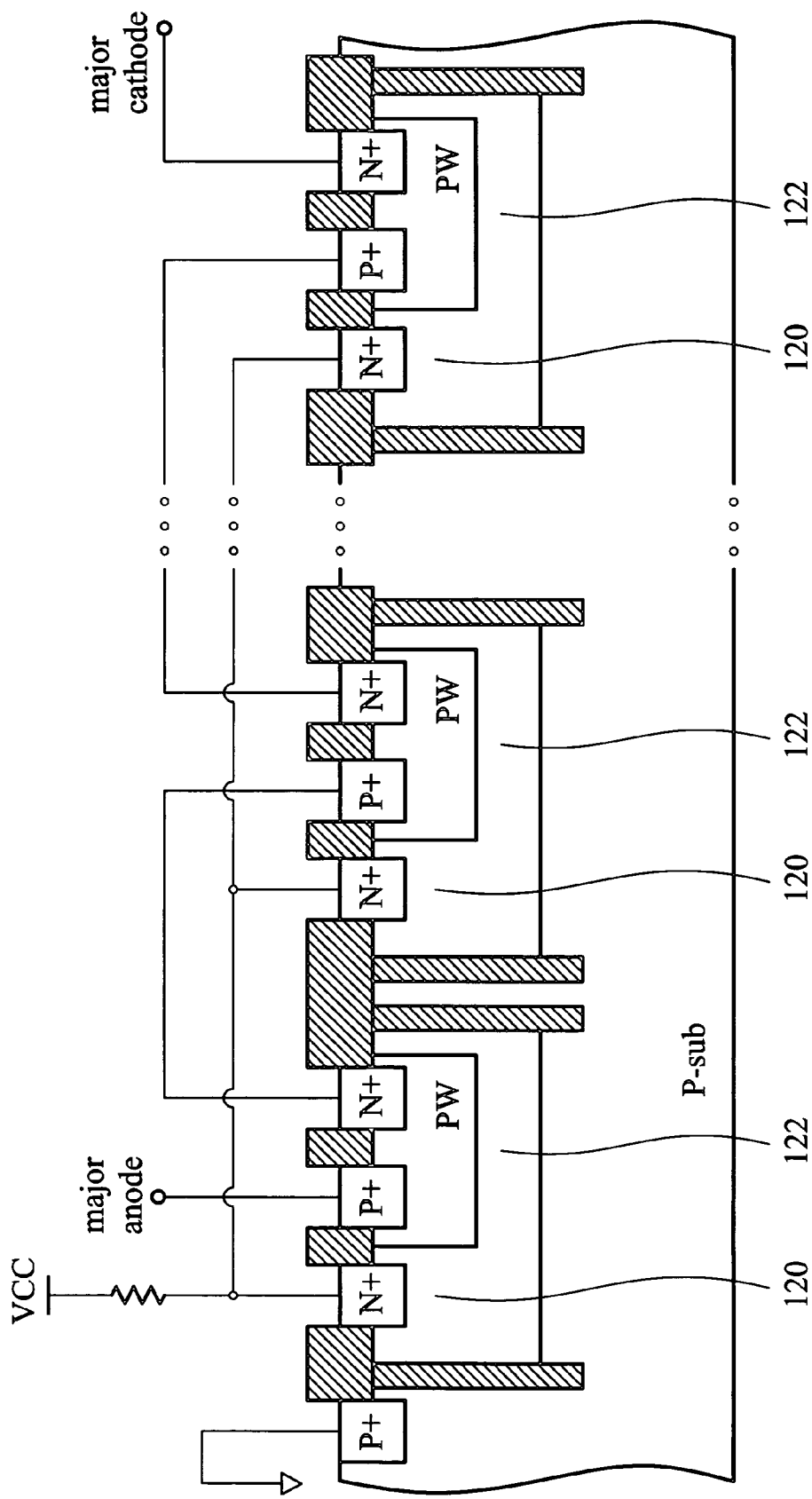

Depending on process technology and layout arrangement, a diode string according to the present invention may differ from the embodiment shown in FIG. 1a. FIGS. 4 to 6 show cross sections of three diode strings further embodying the present invention.

The diode string in FIG. 4 can be fabricated by triple-well CMOS process. Unlike to the single deep N-well 112 in FIG. 1a, there are several deep N-wells 112 together with N-wells 110. N-wells 110 and deep N-wells 112 have substantially the same voltage since they electrically couple to each other through interconnect and heavily-doped N regions 116.

The diode string in FIG. 5 can be fabricated by bipolarity complimentary metal oxide semiconductor (BICMOS) process that provides shallow and deep trench isolation. In FIG. 5, heavily-doped N sinkers 120 and a heavily-doped N buried layer 122 together become a separation region to isolate P-wells 106. Heavily-doped N sinkers 120 in FIG. 5 can be interchanged with normal N-wells. Around the separation region has a deep trench 124 and a shallow trench 126, as shown in FIG. 5, to separate N buried layer 122 from other N buried layers. Deep trench 124 and shallow trench 126 are made of isolating material.

Unlike FIG. 5, the diode string in FIG. 6 has several heavily-doped N buried layers 120 coupled to each other through interconnection and heavily-doped N regions 116, providing substantially equal voltage.

The power line connecting to resistor Rb in the embodiments need not have the highest voltage in a chip, but is required to have a voltage not less than that on the major anode.

While embodiments shown comprise a p substrate, the disclosure is not limited thereto. Those skilled in the art, after comprehending the above embodiments, can easily further derive embodiments with an N substrate and with changes in power supply accordingly. Embodiments with an N substrate are therefore omitted here for lucidity.

While the invention has been described by way of examples and in terms of preferred embodiment, it is to be understood that the invention is not limited thereto, nor is the invention is limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A diode string, comprising:
   diode regions providing diodes, wherein each diode region includes:
   a first polarity region of a first conductivity type, wherein the first polarity region is positioned on a substrate and acts as a first electrode of a corresponding diode; and
   a second polarity region of a second conductivity type different from the first conductivity type, wherein the second polarity region is positioned in the first polarity region and acts as a second electrode of the corresponding diode;
wherein the diodes are connected in series to provide a major anode and a major cathode;
a separation region of the second conductivity type isolating the diode regions from each other; and
a bias resistor connected to the separation region and a first power line, wherein the diode string is configured such that, during normal operation, a voltage of the first power line is greater than a voltage present on the major anode.

2. The diode string of claim 1, wherein the first conductivity type is P-type and the second conductivity type is N-type.

3. The diode string claim 2, wherein during normal operation, the voltage of the major anode does not exceed the voltage of the first power line.

4. The diode string of claim 1, wherein the separation region is coupled to the first power line through the bias resistor.

5. The diode string of claim 1, wherein the separation region comprises a deep well and a first well surrounding the diode regions, and wherein the deep well is deeper than the first well.

6. The diode string of claim 1, wherein the separation region comprises a buried region and a sinker region surrounding the diode regions, and wherein the buried region and the sinker region are fabricated by BICMOS technology.

7. The diode string in of claim 1, further comprising a deep trench and a shallow trench both filled with isolating material, wherein the deep trench and the shallow trench surround the separation region.

8. The diode string of claim 1, wherein the bias resistor comprises one of a polysilicon resistor or a well resistor.

9. An electrostatic discharge (ESD) protection circuit, comprising:
a plurality of diode regions providing diodes, the plurality of diode regions forming a diode string, wherein each diode region includes a first polarity region of a first conductivity type, positioned on a substrate and acting as a first electrode of a corresponding diode, and a second polarity region of a second conductivity type different from the first conductivity type, positioned in the first polarity region and acting as a second electrode of the corresponding diode, wherein the diodes are connected in series to provide a major anode and a major cathode, and wherein a separation region of the second conductivity type isolates the diode regions from each other;
a bias resistor connected to the separation region and a first power line; and
second and third power lines, respectively coupled to the major anode and cathode of the diode string;
wherein the ESD protection circuit is configured such that, during normal operation, a voltage of the first power line is greater than a voltage present on the major anode; and
wherein during normal operation, the diode string is forward biased and closed.

10. The ESD protection circuit of claim 9, further comprising:
a trigger resistor connected in series with the diode string and coupled between the second and third power lines; and
a primary ESD device coupled between the second and third power lines, wherein the primary ESD device comprises a trigger node connected to the trigger resistor and the diode string.

11. The ESD protection circuit of claim 10, wherein the primary ESD device is a bipolar junction transistor (BJT) and the trigger node is the base of the BJT.

12. The ESD protection circuit of claim 10, wherein the primary ESD device is a field effect transistor and the trigger node is the gate of the field effect transistor.

13. A diode string, comprising;
diode regions disposed in a substrate;
bipolar junction transistors (BJTs), wherein each BJT includes one of the diode regions, wherein each BJT comprises a collector, an emitter and a base, wherein the emitter is connected to the base of a following BJT, and wherein the base of a first BJT and the emitter of a last BJT act as two major electrodes of the diode string;
a separation region disposed in the substrate and isolating the diode regions from each other; and
a bias resistor connected to the separation region and a first power line;
wherein the diode string is configured such that, during normal operation, a voltage of the first power line is greater than a voltage present on the base of the first BJT.

14. The diode string of claim 13, wherein all the BJTs are NPN.

15. The diode string of claim 14, wherein during the normal operation the voltage of the first power line is the highest voltage on a chip.

16. The ESD protection circuit of claim 13, wherein the bias resistor comprises one of a polysilicon resistor or a well resistor.

17. An ESD protection circuit on a chip, comprising;
a diode string including:
diode regions disposed in a substrate;
bipolar junction transistors (BJTs), wherein each BJT includes one of the diode regions, wherein each BJT comprises a collector, an emitter and a base, wherein the emitter is connected to the base of a following BJT, and wherein the base of a first BJT and the emitter of a last BJT act as two major electrodes of the diode string;
a separation region disposed in the substrate and isolating the diode regions from each other; and
a bias resistor connected to the separation region and a first power line; and
second and third power lines, respectively coupled to the major electrodes of the diode string;
wherein the ESD protection circuit is configured such that, during normal operation, a voltage of the first power line is greater than a voltage present on the base of the first BJT; and
wherein during the normal operation the diode string is forward biased.

18. The ESD protection circuit of claim 17, further comprising:
a trigger resistor connected in series with the diode string and coupled between the second the third power lines; and
a primary ESD device coupled between the second and third power lines and having a trigger node connected to the trigger resistor and the diode string.

19. An apparatus, comprising:
a semiconductor substrate;
a plurality of diode regions formed on the substrate, the plurality of diode regions forming a diode string, wherein each diode region comprises a first well including first and second doped regions of different types, a second well located adjacent to the first well isolating the diode regions from each other, wherein the second well includes a third doped region;

a third well disposed between the first well and the substrate; and a resistor coupling the third doped region to a power line of the substrate, wherein the apparatus is configured such that, during normal operation, a voltage present on the power line is greater than a voltage present on a major anode of the diode string.

20. The apparatus of claim 19, wherein at least one of the diode regions further comprises:

a trench disposed between the second well and the substrate.

21. The apparatus of claim 20, wherein the trench and the third well isolate the second well of the at least one of the diode regions from the substrate.

22. The apparatus of claim 19, wherein the resistor comprises one of a polysilicon resistor or a well resistor.

23. The apparatus of claim 19, wherein the second well is shared among the diode regions.

24. The apparatus of claim 23, wherein the diode regions comprise a diode string including a first diode region and a last diode region, and wherein the first diode region and the last diode region of the diode string further comprise:

a trench disposed between the second well and the substrate.

25. The apparatus of claim 24, wherein the trench, the third well of the first diode region, and the third well of a second diode region isolate the second well from the substrate.

26. An integrated circuit, comprising:

a semiconductor substrate;

interconnection circuitry coupled between the substrate and a power source;

a plurality of diode regions formed on the substrate, wherein each diode region includes:

a first well including first and second doped regions of different types;

a second well located adjacent to the first well isolating the diode regions from each other, wherein the second well includes a third doped region; and a third well disposed between the first well and the substrate;

wherein the plurality of diode regions forms a diode string having a major anode and a major cathode;

a resistor coupling the third doped region to the power source, wherein the integrated circuit is configured such that, during normal operation, a voltage of the power source is greater than a voltage present on the major anode.

27. The integrated circuit of claim 26, wherein at least one of the diode regions further comprises:

a trench disposed adjacent to the second well and extending into the substrate.

28. The integrated circuit of claim 27, wherein the trench and the third well isolate the second well of the at least one of the diode regions from the substrate.

29. The integrated circuit of claim 26, wherein the resistor comprises one of a polysilicon resistor or a well resistor.

30. The integrated circuit of claim 26, wherein the second well is shared among the diode regions.

31. The integrated circuit of claim 26, wherein the diode regions comprise a diode string including a first diode region and a last diode region, and wherein the first diode region and the last diode region of the diode string further comprise a trench disposed adjacent to the second well and extending into the substrate.

32. The integrated circuit of claim 31, wherein the trench, the third well of the first diode region, and the third well of the last diode region isolate the second well from the substrate.

* * * * *